United States Patent [19]
Sakurai et al.

[11] Patent Number: 5,999,063
[45] Date of Patent: Dec. 7, 1999

[54] TEMPERATURE-COMPENSATED CRYSTAL OSCILLATOR USING SQUARE-LAW CONVERTER CIRCUITS FOR LOWER AND HIGHER TEMPERATURE SIDES

[75] Inventors: Yasuhiro Sakurai, Sayama; Kiyoshi Nobuoka, Tokorozawa, both of Japan

[73] Assignee: Citizen Watch Co., Ltd., Tokyo, Japan

[21] Appl. No.: 09/095,124

[22] Filed: Jun. 10, 1998

[30] Foreign Application Priority Data

Jun. 13, 1997 [JP] Japan ................................. 9-156791

[51] Int. Cl.$^6$ ............................. H03B 5/04; H03B 5/32; H03L 1/02
[52] U.S. Cl. ............................................ 331/158; 331/176
[58] Field of Search ..................................... 331/158, 176

[56] References Cited

U.S. PATENT DOCUMENTS

| | | | |
|---|---|---|---|
| 5,041,799 | 8/1991 | Pirez | 331/176 |
| 5,473,289 | 12/1995 | Ishizaki et al. | 331/176 |
| 5,731,742 | 3/1998 | Wojewoda et al. | 331/176 |

OTHER PUBLICATIONS

Kuichi Kubo et al; 1996 IEEE International Frequency Control Symposium; pp. 728–734, Aug. 1996.

*Primary Examiner*—Siegfried H. Grimm
*Attorney, Agent, or Firm*—Armstrong, Westerman, Hattori, McLeland & Naughton

[57] ABSTRACT

The invention provides a temperature-compensated crystal oscillator employing an AT-cut crystal resonator in a crystal oscillation circuit, having a substantially constant oscillation frequency at approximately room temperature, wherein an output of a temperature sensor, having a substantially rectilinear temperature characteristic, is converted into square-law cure signals by a square-law converter circuit on the lower temperature side and a square-law converter circuit on the higher temperature side, respectively, which are then combined together by a signal synthesis circuit, producing a rectilinear correction signal. Frequency adjustment circuits are controlled by the signal, and temperature compensation is achieved by executing rectilinear correction of the oscillation frequency of the crystal oscillation circuit. In the case where the oscillation frequency of the AT-cut crystal resonator has a temperature characteristic having any gradient, a gradient is added to the rectilinear correction signal.

20 Claims, 8 Drawing Sheets

TEMPERATURE-COMPENSATED CRYSTAL OSCILLATOR USING SQUARE-LAW CONVERTER CIRCUITS FOR LOWER AND HIGHER TEMPERATURE SIDES

BACKGROUND OF THE INVENTION

1. Field of the Invention

The present invention relates to a temperature-compensated crystal oscillator mounted in communications equipment such as a cellular phone, and the like.

2. Description of the Related Art

A temperature-compensated crystal oscillator mounted in communications equipment such as a cellular phone and the like has an AT-cut crystal resonator (crystal unit) in a frequency band of 10 MHz as the oscillation source thereof, and the AT-cut crystal resonator is provided with some type of frequency adjustment circuit, making up a temperature compensation circuit. The temperature characteristic of the AT-cut crystal resonator, as expressed by a cubic curve, is canceled out by the temperature compensation circuit, thus stabilizing oscillation frequencies.

Such a temperature-compensated crystal oscillator is broadly broken down into two types depending on the configuration of the temperature compensation circuit: an analog temperature-compensated crystal oscillator, and a digital temperature-compensated crystal oscillator.

The digital temperature-compensated crystal oscillator is made up of a one-chip semiconductor integrated circuit (IC) with a nonvolatile memory mounted thereon, featuring the capability of achieving temperature compensation in a wide temperature range, and the generation of frequencies with high precision.

However, the same has failed to come into widespread use owing to its drawback of high phase noise.

On the other hand, the analog temperature-compensated crystal oscillator is made up of an AT-cut crystal resonator having the characteristic of a substantially constant oscillation frequency in the temperature range of from 15 to 45° C., and a series-parallel circuit formed by discrete components such as a capacitor and thermistor.

With the analog temperature-compensated crystal oscillator, temperature compensation is effected mainly in a lower temperature range not higher than 15° C., and in a higher temperature range not lower than 45° C., respectively, through combination of the temperature characteristics of components thereof, and most of the products in widespread use today are of this type.

Temperature compensation by use of an analog temperature-compensated crystal oscillator made up of a one-chip semiconductor IC (referred to hereinafter as one-chip analog temperature-compensated crystal oscillator) instead of through the combination of the temperature characteristics of individual components has very recently been reported in, for example, literature by Kuichi Kubo, et al., 1996 IEEE INTERNATIONAL FREQUENCY CONTROL SYMPOSIUM, p. 728–734.

According to a temperature compensation method using the one-chip analog temperature-compensated crystal oscillator, after conducting a detailed study on the temperature characteristic of an AT-cut crystal resonator using a thermostatic bath (thermostat), a constant of a cubic curve generation circuit for canceling out the characteristic is written to a nonvolatile memory.

All temperature-compensated crystal oscillators have recently been forced to face up to the challenge of reduction in size and cost. In addition to that, in the light of an increasing tendency for the adoption of a system called CDMA aiming at international sharing of a common communications system, demand for expansion in the range of temperature compensation has been on the increase.

The range of temperature compensation up to now has been from minus 30° C. to plus 75° C. even in the case of a specification requiring the widest range. However, the CDMA requires that the range be expanded from minus 30° C. to plus 85° C.

A problem with the analog temperature-compensated crystal oscillator in achieving temperature compensation by taking advantage of a combination of the temperature characteristics of the components thereof is unavailability of suitable components meeting demand for low cost yet capable of effecting temperature compensation on the higher temperature side, not lower than 75° C. This makes it difficult to expand the range for temperature compensation with the use of the analog temperature-compensated crystal oscillator.

The digital temperature-compensated crystal oscillator has no problem in respect of the range of temperature compensation.

However, it has a problem in that it is difficult to lower the phase noise level as low as that for the analog temperature-compensated crystal oscillator.

The one-chip analog temperature-compensated crystal oscillator has, in theory, a high potential of meeting all such requirements. However, with the conventional one-chip analog temperature-compensated crystal oscillator, it is not easy to reduce the cost of writing data for temperature compensation, leading to a problem of difficulty in achieving reduction in the total cost thereof.

In all, with the configuration of the conventional temperature-compensated crystal oscillators, it is extremely difficult to satisfy all the requirements, and the present state is far from the one desired by telephone manufacturers.

SUMMARY OF THE INVENTION

The invention has been developed in the light of the present situation as described in the foregoing, and an object of the invention is to provide a temperature-compensated crystal oscillator available at low cost, yet generating no phase noise, and capable of expanding the range of temperature compensation.

The temperature-compensated crystal oscillator according to the invention essentially belongs, in configuration, to one-chip analog temperature-compensated crystal oscillators, but is capable of achieving expansion in the range of temperature compensation in spite of the low cost thereof by providing newly devised means for generating a temperature compensation signal, and accompanying adjustment means.

A first device of the means for generating the temperature compensation signal serves to generate two elements composing the temperature compensation signal. The device enables the temperature compensation signal to be adapted to the temperature characteristics of AT-cut crystal resonators without measuring the temperature characteristic of an individual AT-cut crystal resonator. This point is first elaborated on hereinafter.

It is well known that the temperature characteristic curve of an oscillation frequency of an AT-cut crystal resonator is a cubic curve. However, an absolute value of the oscillation frequency and a shape of the cubic curve vary diversely from one crystal resonator to another depending on variation in the cut angle of respective quartz crystals, and so forth.

It has, however, been found that the temperature characteristic curves for all AT-cut crystal resonators substantially overlap one cubic curve if an absolute value of the oscillation frequency is shifted in the vertical direction such that all the cubic curves converge at one point at a reference temperature (in the case of crystal resonators for use in communications, generally at 25° C.), this being called 'f-zero (frequency-zero) adjustment', and correction in an amount proportional to differences in temperature from the reference temperature is made at each temperature such that gradients of the cubic curves are rendered substantially zero in the proximity of the reference temperature, this being called 'gradient correction'.

The fact that the temperature characteristic curves having various initial characteristics overlap on one curve means that only if the 'f-zero adjustment' and 'gradient correction' are executed according to the manufacturing spreads of the respective AT-cut crystal resonators, a remaining correction, that is, a correction to linearize the cubic curve (this is called 'rectilinear correction') may be accomplished by a factor common to all AT-cut crystal resonators.

That the factor for rectilinear correction is common to all AT-cut crystal resonators means that the factor for rectilinear correction can be predetermined. Therefore, with reference to the rectilinear correction, it is unnecessary to measure the temperature characteristic of the respective AT-cut crystal resonators with the use of a thermostatic bath, or the like.

This means that the measurement of the temperature characteristic with the use of a thermostatic bath or the like, is required only to find a factor for gradient correction, and if information required for predetermining the gradient correction is available, the measurement of the temperature characteristic for determining the temperature compensation signal is not required at all once the AT-cut crystal resonator is mounted in the temperature-compensated crystal oscillator.

A method of manufacturing the AT-cut crystal resonator for use in the temperature-compensated crystal oscillator incorporates a standard process of selecting a frequency deviation at 70° C. against the reference temperature to an accuracy 1 ppm (part per million), and determining ranking of products accordingly. Therefore, as long as there is no demand for frequency precision higher than 1 ppm, it is justifiable to determine the gradient correction factor according to such ranking.

That is, if a method is adopted whereby the temperature compensation signal is broken down into the two elements, that is, a rectilinear correction signal and gradient correction signal, generating the rectilinear correction signal and gradient correction signal separately, the temperature-compensated crystal oscillator is able to effect temperature compensation of the AT-cut crystal resonator without making measurement of the temperature characteristic thereof at all. The need for a thermostatic bath or the like arises only in the process of performing inspection at shipment.

Further, if a nonvolatile memory is used as means for executing the gradient correction, the cost of adjustment is very low since such an operation involves only the electrical writing of data for correction to the nonvolatile memory at the reference temperature.

The description given above is based on the assumption that there is no manufacturing spread in temperature sensors, but as the same has in practice some manufacturing spread, there will arise a need for making measurement for correction thereof by use of the thermostatic bath. Then, a cost of adjustment will be incurred.

However, depending on the configuration of the temperature sensor, manufacturing spread can be corrected at one point of the reference temperature. For example, this can be achieved by use of a circuit formed by connecting a resistor and MOS transistor in series as a temperature sensor, and the cost of adjustment is again very low if the manufacturing spread is corrected by the nonvolatile memory.

A second device of the means for generating the temperature compensation signal concerns the rectilinear correction signal.

With a configuration provided with a cubic curve signal generation circuit as in the case of the conventional one-chip analog temperature-compensated crystal oscillator, the cost of a semiconductor IC goes up because circuit scale becomes larger. Therefore, according to the invention, the rectilinear correction signal is generated in the following manner.

More specifically, a cubic curve representing the temperature characteristic of the AT-cut crystal resonator can be broken down into a curve segment on the lower temperature side not higher than about 15° C., protruding upward, a substantially straight segment between about 15° C. and 45° C., and a curve segment on the higher temperature side not lower than about 45° C., protruding downward, and if the curve segment on the lower temperature side only, or the curve segment on the higher temperature side only, is looked at, respective curve segments can be approximated by a square-law curve.

That is, in the region not higher than 15° C., a cubic curve on the lower temperature side can be approximated by a curve proportional to the square of temperature differences from 15° C., and in the region not lower than 45° C., a cubic curve on the higher temperature side can be approximated by a curve proportional to the square of temperature differences from 45° C.

Then, by use of the temperature sensor with an output thereof undergoing linear change relative to temperature, and a square-law region of a MOS transistor, a square-law curve signal can be generated easily without the use of any complex circuit. However, as the MOS transistor has a certain manufacturing spread, it is desirable to provide a circuit for correcting the manufacturing spread so as to generate a constant square-law curve signal all the time.

Two square-law curve signals partially approximated to a cubic curve may be thus generated and used as an independent rectilinear correction signal on the lower temperature side and the higher temperature side, respectively, or by combining the two square-law curve signals together, a signal approximated to a cubic curve substantially over the entire temperature range may be generated, and used as the rectilinear correction signal.

Meanwhile, it has previously been described that the rectilinear correction signal is common to all the AT-cut crystal resonators. However, the temperature-compensated crystal oscillator for use in cellular phones has in fact several classes of frequencies, and capacitance ratios of the AT-cut crystal resonators vary somewhat by frequency. Accordingly, if the rectilinear correction is executed with the same variable capacitance, some adjustment of the rectilinear correction signal according to frequency is required.

However, there is no need for providing a special circuit dedicated for such adjustment because the circuit for correcting the manufacturing spread of the MOS transistors for generating the square-law curve signals may be utilized for the purpose.

A third device of the means for generating the temperature compensation signal concerns means for signal synthesis by combining the square-law curve signal on the lower temperature side with the square-law curve signal on the higher temperature side, for producing the rectilinear correction signal, and means for adding a gradient to the rectilinear correction signal. That is, signal synthesis is achieved without causing an increase in circuit scale by proper use or joint use of a resistance divider circuit and an inverting amplifier.

The rectilinear correction described in the foregoing does not refer to a straight line in mathematical terms, but refers to a line falling within a linear band with a width of tolerable frequency deviation for the temperature-compensated crystal oscillator.

The basic configuration of the temperature-compensated crystal oscillator according to the invention is described hereinafter.

That is, the temperature-compensated crystal oscillator basically comprises a crystal oscillation circuit employing an AT-cut crystal resonator having a substantially constant oscillation frequency at approximately room temperature, a temperature sensor with an output having a substantially rectilinear temperature characteristic, a square-law converter circuit on the lower temperature side for converting the output of the temperature sensor into a square-law curve signal on the lower temperature side, a frequency adjustment circuit on the lower temperature side, under control of the square-law converter circuit on the lower temperature side, for adjusting the oscillation frequency of the crystal oscillation circuit, a square-law converter circuit on the higher temperature side for converting the output of the temperature sensor into a square-law curve signal on the higher temperature side, and a frequency adjustment circuit on the higher temperature side, under control of the square-law converter circuit on the higher temperature side, for adjusting the oscillation frequency of the crystal oscillation circuit.

In the temperature-compensated crystal oscillator, the square-law converter circuit on the lower temperature side, and the square-law converter circuit on the higher temperature side may preferably be made up of a circuit formed by connecting a MOS transistor and a resistor in series, respectively, with the gate of the respective MOS transistors serving as the input terminal, and the drain thereof serving as the output terminal.

Further, either of the square-law converter circuit on the lower temperature or the square-law converter circuit on the higher temperature side may preferably be a circuit formed by connecting a p-channel MOS transistor and a resistor in series, and the other circuit may preferably be a circuit formed by connecting an n-channel MOS transistor, and a resistor in series, the respective MOS transistors having the gate thereof serving as the input terminal, and the drain thereof serving as the output terminal.

Also, in the temperature-compensated crystal oscillator according to the invention, a signal synthesis circuit for combining the square-law curve signal generated by the square-law converter circuit on the lower temperature side with the square-law curve signal generated by the square-law converter circuit on the higher temperature side, and a frequency adjustment circuit under control of the signal synthesis circuit, for adjusting the oscillation frequency of the crystal oscillation circuit, may be substituted for the frequency adjustment circuit on the lower temperature side and the frequency adjustment circuit on the higher temperature side.

The signal synthesis circuit of the temperature-compensated crystal oscillator may be a circuit for combining the square-law curve signal generated by the square-law converter circuit on the lower temperature side with the square-law curve signal generated by the square-law converter circuit on the higher temperature side via two resistors having an equal temperature coefficient.

On the other hand, the signal synthesis circuit may be a circuit for combining the square-law curve signal generated by the square-law converter circuit on the lower temperature side with the square-law curve signal generated by the square-law converter circuit on the higher temperature side via a resistor on the lower temperature side and the higher temperature side, respectively, each having an equal temperature coefficient, and the resistance value of the resistor on the lower temperature side may preferably be made greater than that of the resistor on the higher temperature side.

Further, in the case of the square-law converter circuit on the lower temperature side and the square-law converter circuit on the higher temperature side being circuits of the same configuration, the signal synthesis circuit may preferably be made up of an inverting amplifier for inverting either of the square-law curve signal generated by the square-law converter circuit on the lower temperature side and the square-law curve signal generated by the square-law converter circuit on the higher temperature side, and adding the other thereto before amplification.

The temperature-compensated crystal oscillator according to the invention may comprise a constant gradient addition circuit for adding an adjustable constant gradient over the entire range of application temperatures to an output of the signal synthesis circuit so that the frequency adjustment circuit is controlled by an output of the constant gradient addition circuit.

The constant gradient addition circuit described may comprise a proportional conversion circuit for generating a proportion signal against the output of the temperature sensor by an externally adjustable proportion factor, and an inverting amplifier for receiving and inverting an output of the signal synthesis circuit with the proportion signal generated by the proportional conversion circuit as an inversion point.

Further, the proportional conversion circuit may comprise an inverting amplifier for inverting the output of the temperature sensor with a signal having no temperature dependence as an inversion point, a switch group consisting of a plurality of switches with one terminal thereof connected, respectively, to a plurality of nodes at different potentials between the input terminal and output terminal of the inverting amplifier, and with all the other terminals thereof connected to a common terminal, and a nonvolatile memory storing data for controlling ON/OFF switching of the respective switches making up the switch group, the common terminal of the switch group being used as the output terminal of the proportion signal.

The temperature-compensated crystal oscillator according to the invention may comprise a broken line gradient addition circuit for separately adding an adjustable gradient on the lower temperature side and the higher temperature side to an output of the signal synthesis circuit in place of the constant gradient addition circuit so that the oscillation frequency of the crystal oscillation circuit is adjusted by the frequency adjustment circuit under control of the broken line gradient addition circuit.

In this case, the broken line gradient addition circuit may comprise: a conversion circuit on the lower temperature side for outputting a signal proportional to the output of the temperature sensor if the ambient temperature is not higher than a reference temperature, and outputting a constant signal if the temperature is above the reference temperature; a conversion circuit on the higher temperature side for outputting a signal proportional to the output of the temperature sensor if the ambient temperature is not lower than a reference temperature, and outputting a constant signal if the temperature is below the reference temperature; a circuit for generating a broken line signal by synthesizing an output of the conversion circuit on the lower temperature side with an output of the conversion circuit on the higher temperature side; and an inverting amplifier for receiving; and inverting the output of the signal synthesis circuit with the broken line signal as an inversion point.

In the temperature-compensated crystal oscillators described above, the temperature sensor, square-law converter circuit on the lower temperature side, and square-law converter circuit on the higher temperature side, respectively, may be made up of a series-connected circuit formed of MOS transistors having an identical characteristic and resistors having an identical characteristic, provided with a circuit for correcting manufacturing spreads of the MOS transistors and a circuit for correcting manufacturing spreads of the resistors, respectively. They may further preferably comprise a nonvolatile memory storing data for collectively controlling the circuits for correcting manufacturing spreads of the MOS transistors and the circuits for correcting manufacturing spreads of the resistors.

The temperature-compensated crystal oscillator according to the invention may otherwise comprise a circuit for correcting manufacturing spreads of the temperature sensor and square-law converter circuit on the lower temperature side, and the square-law converter circuit on the higher temperature side, respectively, by a onetime programmable memory.

The above and other objects, features and advantages of the invention will be apparent from the following detailed description which is to be read in conjunction with the accompanying drawings.

DETAILED DESCRIPTION OF THE PREFERRED EMBODIMENTS

Embodiments of the invention are described in detail hereinafter with reference to the accompanying drawings. In description of all the embodiments given hereinafter, aspects unrelated to temperature compensation such as f-zero adjustment is omitted.

First Embodiment: FIGS. 1 to 6

Figure 1:
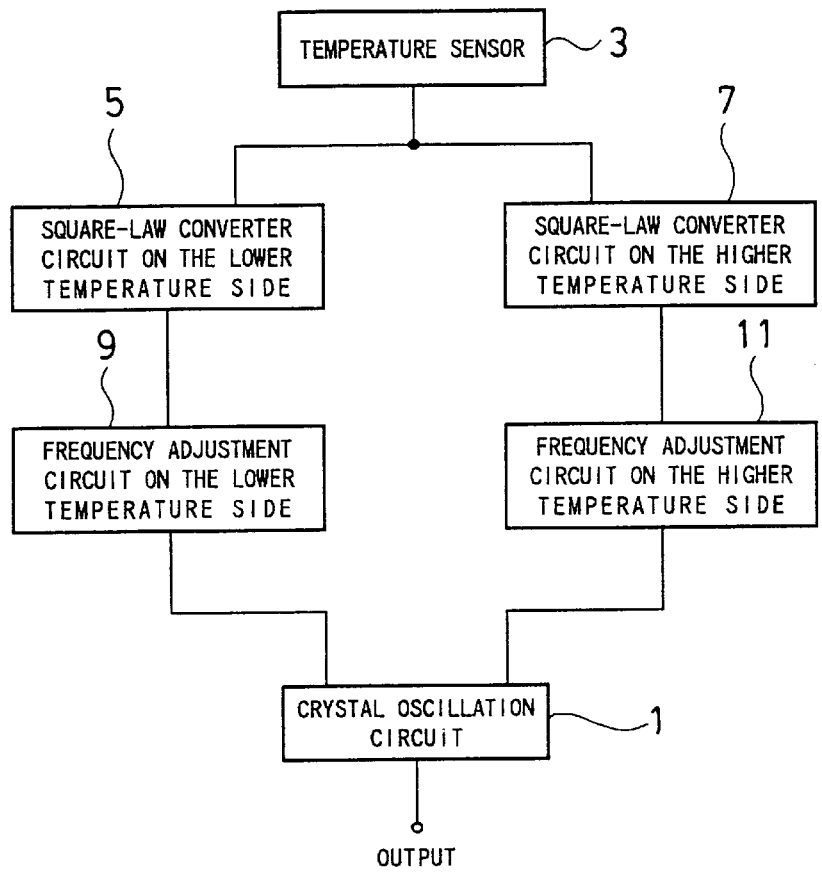
FIG. 1 is a block diagram showing a configuration of a first embodiment of a temperature-compensated crystal oscillator according to the invention.

To begin with, a first embodiment of a temperature-compensated crystal oscillator according to the invention is described. FIG. 1 is a block diagram showing a configuration of the temperature-compensated crystal oscillator.

The temperature-compensated crystal oscillator comprises: a crystal oscillation circuit 1 provided with an AT-cut crystal resonator having a substantially constant oscillation frequency at approximately room temperature; a temperature sensor 3 whose output has a temperature characteristic represented by a substantially straight line; a square-law converter circuit 5 on the lower temperature side for converting the output of the temperature sensor 3 into a square-law curve signal on the lower temperature side; a frequency adjustment circuit 9 on the lower temperature side, which is under control of the square-law converter circuit 5 on the lower temperature side and connected to the crystal oscillation circuit 1, for adjusting the oscillation frequency thereof; a square-law converter circuit 7 on the higher temperature side for converting the output of the temperature sensor 3 into a square-law curve signal on the higher temperature side; and, a frequency adjustment circuit 11 on the higher temperature side, which is under control of the square-law converter circuit 7 on the higher temperature side and connected to the crystal oscillation circuit 1, for adjusting the oscillation frequency thereof.

In the crystal oscillation circuit 1, an AT-cut crystal resonator having no frequency shift due to variation in temperature around room temperature, a so-called "flat crystal", is employed. The temperature characteristic of the frequency thereof is shown by a cubic curve 13 indicated by the solid line in FIG. 2. As is evident from FIG. 2, frequency deviation in the temperature range of 15 to 45° C. falls within the deviation tolerance of the temperature-compensated crystal oscillator.

Figure 2:
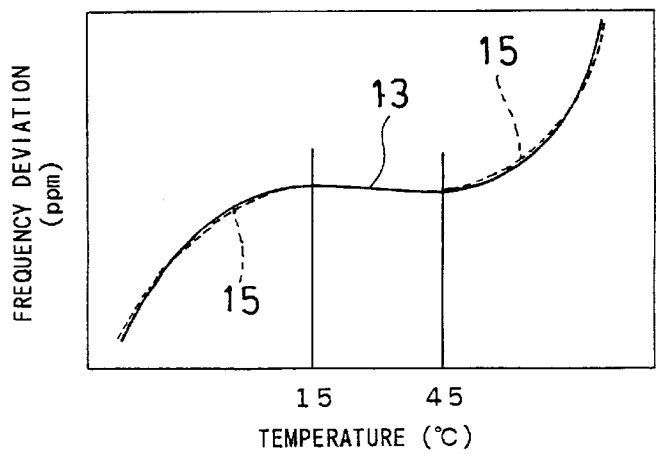
FIG. 2 is a diagram of temperature-frequency deviation characteristic showing the temperature characteristic, by way of example, of an AT-cut crystal resonator used in carrying out first and second embodiments of the invention, and an example of an approximate curve exhibiting the same.

Meanwhile, in FIG. 2, in temperature regions not higher than 15° C. and not lower than 45° C., a square-law curve 15 representing the case where an optimum coefficient is selected is indicated by the broken line, overlapping the cubic curve 13.

It is clear from the way in which these curves overlap each other that an approximation to curved portions of the cubic curve 13 representing the temperature characteristic of the frequency of the crystal resonator can be made by the square-law curve 15.

Accordingly, the square-law curve signals with frequency deviation thereof inverted are generated by means of the square-law converter circuit 5 on the lower temperature side in the temperature region not higher than 15° C. and the square-law converter circuit 7 on the higher temperature side in the temperature region not lower than 45° C., respectively, so as to be approximated to a curved portion of the cubic curve 13 on the lower temperature side, and the same on the higher temperature side, as shown in FIG. 2, respectively. The frequency adjustment circuit 9 on the lower temperature side, and frequency adjustment circuit 11 on the higher temperature side, shown in FIG. 1, are controlled by the square-law curve signals, respectively.

The oscillation frequency of the crystal oscillation circuit 1 can thus be adjusted so as to cancel out the frequency deviation according to temperature variation in the temperature region not higher than 15° C. or in the temperature region not lower than 45° C., thereby linearizing the temperature characteristic of the frequency.

With the crystal oscillation circuit employing the flat crystal as in this embodiment, temperature compensation can be achieved only by such rectilinear correction as described.

Figure 3:
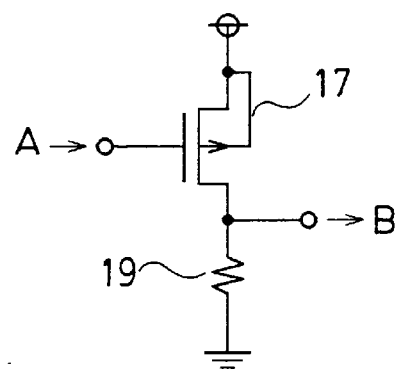
FIG. 3 is a circuit diagram showing a square-law converter circuit formed by connecting a p-channel MOS transistor and a resistor in series.
Figure 4:
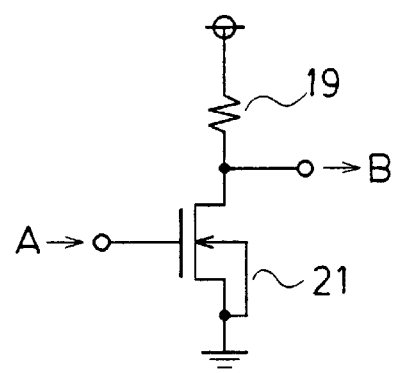
FIG. 4 is a circuit diagram showing a square-law converter circuit formed by connecting an n-channel MOS transistor and a resistor in series.

Now, FIGS. 3 and 4 show specific examples of the square-law converter circuit 5 on the lower temperature side, and the square-law converter circuit 7 on the higher temperature side, respectively, for generating the square-law curve signals. These represent examples wherein the square-law curve signal is generated in a circuit formed by a MOS transistor and a resistor for square-law conversion connected in series.

FIG. 3 shows a square-law converter circuit formed by a p-channel MOS transistor 17 and a resistor 19 for square-law conversion connected in series, and the p-channel MOS transistor 17 has its source connected to the positive power source +V, and its drain connected to one end of the resistor 19, while the other end of the resistor 19 is grounded. The gate of the p-channel MOS transistor 17 serves as the input terminal for a temperature detection signal A output by the temperature sensor 3, and the drain thereof serves as the output terminal for the square-law curve signal B.

FIG. 4 shows a square-law converter circuit formed by an n-channel MOS transistor 21 and a resistor 19 for square-law conversion connected in series, and the resistor 19 has one end connected to the positive power source +V, and the other end connected to the drain of the n-channel MOS transistor 21, while the source of the n-channel MOS transistor 21 is grounded. The gate of the n-channel MOS transistor 21 serves as the input terminal for the temperature detection signal A output by the temperature sensor 3, and the drain thereof serves as the output terminal for the square-law curve signal B.

Either of the square-law converter circuit 5 on the lower temperature side or the square-law converter circuit 7 on the higher temperature side is the same as the circuit shown in FIG. 3 and the other is the same as the circuit shown in FIG. 4.

Both the circuits take advantage of the characteristic of the square-law region of a MOS transistor. That is, when a voltage not lower than the threshold voltage of the MOS transistor is applied to the gate thereof, current flows between the source and drain in amperage in proportion to the square of a difference between the voltage applied to the gate and the threshold voltage. Therefore, by allowing the current to flow through the resistor for square-law conversion and converting the current into a voltage, the square-law curve signal can be generated.

Now, the temperature detection signal A delivered from the temperature sensor 3 having the characteristic of an output voltage thereof varying linearly relative to ambient temperature is inputted to the gate of the P channel MOS transistor 17 in FIG. 3, and the n-channel MOS transistor 21 in FIG. 4, respectively. Then, it is set such that as temperature declines downward from 15° C., the voltage applied to the gate of the n-channel MOS transistor 21 comes up from around the threshold voltage, or as temperature rises upward from 45° C., the absolute value of the source to gate voltage applied to the p-channel MOS transistor 17 rises above around the threshold voltage.

In this way, the square-law curve signal on the lower temperature side can be generated from the drain of the n-channel MOS transistor 21 in FIG. 4, and the square-law curve signal on the higher temperature side can be generated from the drain of the p-channel MOS transistor 17 in FIG. 3, respectively.

Figure 5:
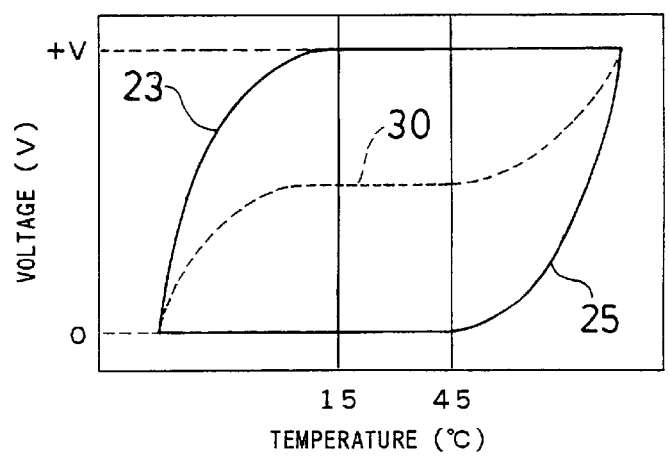
FIG. 5 is a diagram of temperature-voltage characteristics showing an example of square-law curve signals in the first and second embodiments of the invention, and an example of a composite signal synthesized therefrom.

FIG. 5 shows the square-law curve signals generated in this way by way of example.

As shown in FIG. 5, a voltage of the square-law curve signal 23 on the lower temperature side generated by the square-law converter circuit shown in FIG. 4 decreases in proportion to the square of the temperature difference from 15° C. as ambient temperature declines downward from 15° C. while the voltage remains constant at 15° C. or higher.

On the other hand, a voltage of the square-law curve signal 25 on the higher temperature side generated by the square-law converter circuit shown in FIG. 3 increases in proportion to the square of the temperature difference from 45° C. as ambient temperature rises upward from 45° C. while the voltage remains constant at 45° C. or lower.

Thus by taking advantage of the current-voltage characteristic of the square-law region of the MOS transistors, the square-law curve signals can be produced easily without use of any complicated circuit.

As the square-law curve signals generated this way have fairly wide temperature ranges wherein these signals can be approximated to the curve representing the temperature characteristic of the frequency of the AT-cut crystal resonator, expansion in or widening of the range of temperature compensation can be achieved with ease.

The curve 30 indicated by the broken line in FIG. 5 will be described later.

The square-law converter circuits shown in FIGS. 3 and 4, respectively, are formed on the assumption that the temperature sensor delivers an output having a substantially linear temperature characteristic. However, various types of such temperature sensors are available.

For example, a series circuit formed by a MOS transistor and a resistor, the same as the square-law converter circuit shown in FIG. 3 or FIG. 4, may be used as the temperature sensor. In such a case, use is made of the circuit by applying a constant voltage (for example, a threshold voltage+about 0.3V) to the gate of the MOS transistor. As the drain current of the MOS transistor thereby undergoes a linear change according to variation in temperature, a signal obtained by converting the current into a voltage via the resistor is in linear relation with ambient temperature so that the signal can be outputted as a temperature detection signal.

Further, as the temperature characteristic of a flat crystal is common with all AT-cut crystal resonators, there is no need for measuring the temperature characteristics of individual temperature-compensated crystal oscillators. It is sufficient to generate a common square-law curve signal according to the class of respective frequencies.

However, in the case of generating the square-law curve signal by connecting the resistor and the MOS transistor in series as shown in FIG. 3 or FIG. 4, there is a need for compensating for manufacturing spreads of such components.

Since the configuration whereby the resistor and the MOS transistor are connected in series is the same circuit configuration as for the temperature sensor, and compensation for manufacturing spreads can be made on the basis of only one point, that is, the reference temperature as in the case of the temperature sensor, cost of adjustment is quite low.

In the example described above, the circuit employing the n-channel MOS transistor 21, as shown in FIG. 4, is used for the square-law converter circuit 5 on the lower temperature side, and the circuit employing the p-channel MOS transistor 17, as shown in FIG. 3, is used for the square-law converter circuit 7 on the higher temperature side. However, use of the MOS transistors may be made the other way around provided that the relationship of the input voltage to the oscillation frequency is reversed between the frequency adjustment circuits 9 and 11.

Further, the same circuit may be used for both the square-law converter circuit on the lower temperature side and that on the higher temperature side, in which case, the temperature detection signal A from the temperature sensor 3 is inverted before being applied to the gate of one of the MOS transistors, and an output therefrom (the square-law curve signal) is inverted as well before being inputted to the frequency adjustment circuit, or the relationship between the input voltage and oscillation frequency in the frequency adjustment circuit on the lower temperature side must be reversed from the same in the frequency adjustment circuit on the higher temperature side.

Figure 6:
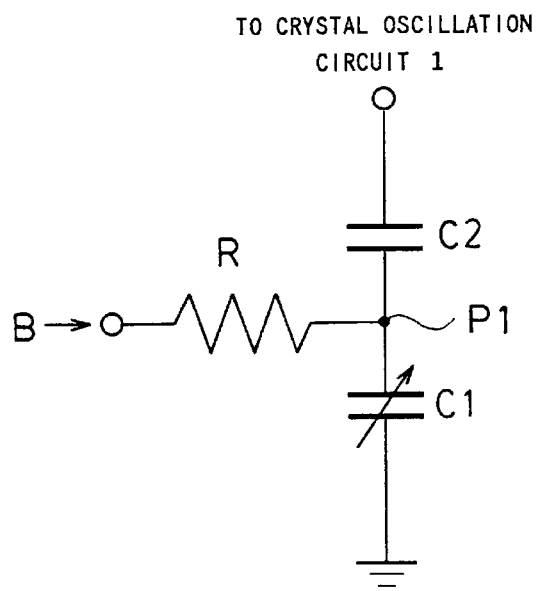
FIG. 6 is a circuit diagram showing an example of a variable capacitance circuit used as a frequency adjustment circuit in respective embodiments of the invention.

For example, the variable capacitance circuit shown in FIG. 6. may be substituted for the frequency adjustment circuit on the lower temperature side 9 and frequency adjustment circuit on the higher temperature side 11, shown in FIG. 1.

The variable capacitance circuit is formed by coupling a variable capacitance element C1 and a capacitor C2 for cutting off DC current in series, and this series circuit is extended between the crystal oscillation circuit 1 in FIG. 1 and ground as a load for adjusting the oscillation frequency of the crystal oscillation circuit 1.

The square-law curve signal B from the square-law converter circuit 5 or 7 is applied via an input resistor R to a connecting node P1 between the variable capacitance element C1 and the capacitor C2 to control the capacitance value of the variable capacitance element C1.

The variable capacitance circuit shown in FIG. 6 by way of example is quite a common type. However, respective elements thereof are subject to some constraint when the circuit is used in the temperature-compensated crystal oscillator.

That is, any element of a voltage control type may be adopted for the variable capacitance element C1. However, a MOS capacitor is most suitable because of the ease with which the same can be incorporated in a semiconductor integrated circuit. Further, in the example shown in FIG. 6, the variable capacitance element C1 is grounded, but may be connected to a node at an optional potential, having a large variable width of capacitance values, since any DC potential at the connecting node can be ignored.

It is desirable that the capacitor C2 for cutting off DC current is a capacitor having no dependence on voltage although such conditions are not essential if the capacitance value thereof is large in comparison with that of the variable capacitance element C1. Rather it is important that the conditions exist wherein the stray capacitances thereof is very small so as not to reduce the variable width of capacitance values of the variable capacitance element C1.

A resistor on the order of $1M\Omega$ is sufficient for use as the input resistor R, and a diffused resistor, MOS resistor, or the like is unsuitable for the purpose because the variable width of capacitance values of the variable capacitance element C1 is reduced if the circuit is composed of elements having a large stray capacitance. A polysilicon resistor is most suitable from the viewpoint of incorporating the same in a semiconductor integrated circuit.

As is evident from the foregoing description, with the first embodiment of the temperature-compensated crystal oscillator according to the invention, temperature compensation for the AT-cut crystal resonator having a constant frequency at approximately room temperature can be achieved with ease in a wide temperature range by use of the square-law curve signal generated by the MOS transistors.

Figure 7:
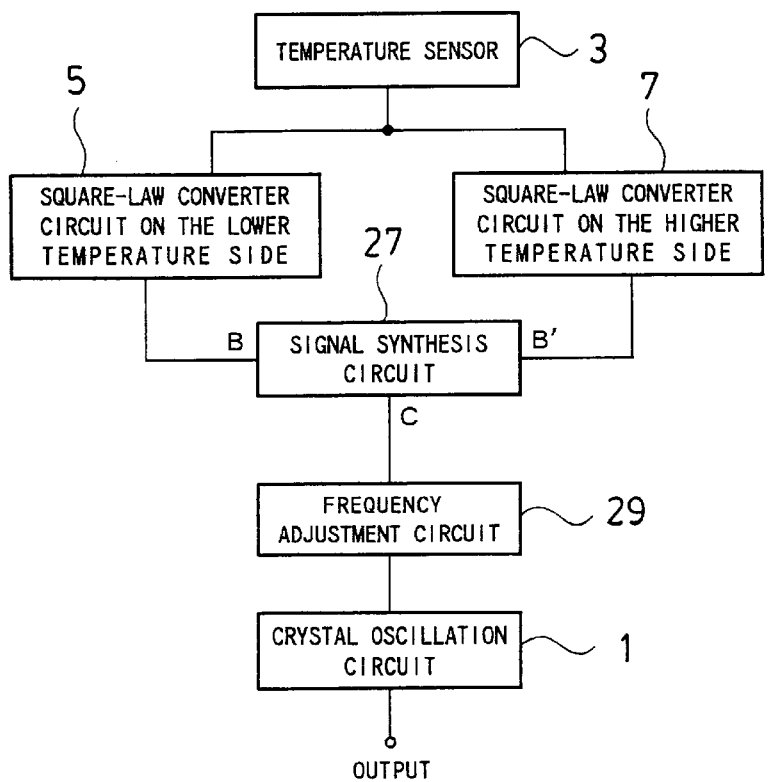
FIG. 7 is a block diagram showing a configuration of a second embodiment of a temperature-compensated crystal oscillator according to the invention.
Figure 8:
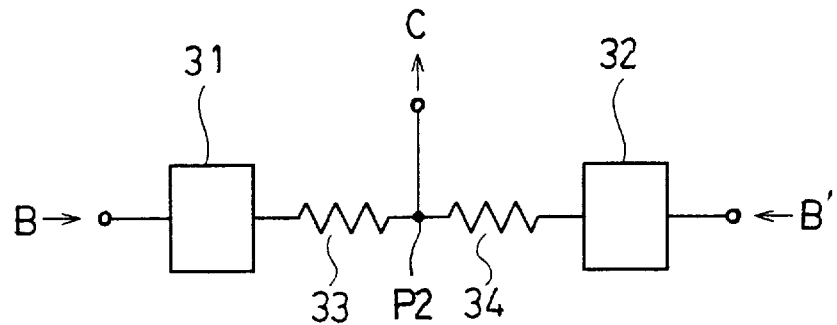
FIG. 8 is a block schematic diagram showing an example of a signal synthesis circuit 27 of the temperature-compensated crystal oscillator in FIG. 7.
Figure 9:
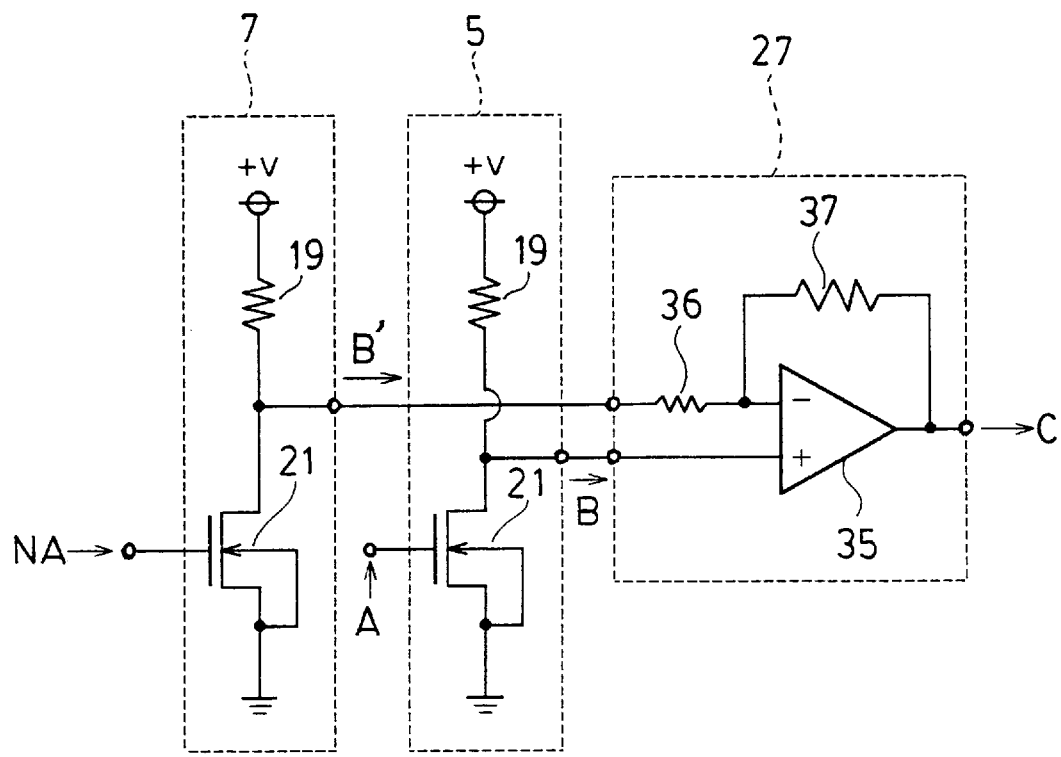
FIG. 9 is a circuit diagram showing another example of the signal synthesis circuit 27 of the temperature-compensated crystal oscillator in FIG. 7 together with a square-law converter circuit on the lower temperature side and on the higher temperature side, respectively.

Second Embodiment: FIGS. 7 to 9

Next, a second embodiment of a temperature-compensated crystal oscillator according to the invention is described. FIG. 7 is a block diagram showing a configuration of the temperature-compensated crystal oscillator.

In FIG. 7, parts corresponding to those shown in FIG. 1 are denoted by the same reference numerals, and description thereof is omitted. The temperature-compensated crystal oscillator shown in FIG. 7 differs from the temperature-compensated crystal oscillator shown in FIG. 1 only in that in place of the frequency adjustment circuit 9 on the lower temperature side and the frequency adjustment circuit 11 on the higher temperature side, as shown in FIG. 1, a signal synthesis circuit 27 and a frequency adjustment circuit 29 are provided.

In this embodiment, a square-law curve signal delivered from a square-law converter circuit 5 on the lower temperature side and a square-law curve signal delivered from a square-law converter circuit 7 on the higher temperature side are synthesized into one rectilinear correction signal through a signal synthesis circuit 27, and an oscillation frequency of a crystal oscillation circuit 1 is adjusted by controlling the frequency adjustment circuit 29 with the rectilinear correction signal to linearize the temperature characteristic of the oscillation frequency. Since a flat crystal is employed as a crystal resonator of the crystal oscillation circuit 1 in this case as well, temperature compensation can be achieved by means of rectilinear correction only.

For the frequency adjustment circuit 29, a variable capacitance circuit, the same as the variable capacitance circuit shown in FIG. 6, is employed, and a capacitance value of a variable capacitance element C1 of the circuit may be controlled by inputting the rectilinear correction signal delivered form the signal synthesis circuit 27 to the input terminal of the frequency adjustment circuit 29.

Various specific configurations of the signal synthesis circuit 27 are conceivable. In this case where the square-law curve signals on both the lower and higher temperature sides are signals equivalent in type to each other, an interior division circuit (resistance divider circuit) using resistors is most suitable for the purpose. An example of the signal synthesis circuit is shown in FIG. 8.

In the signal synthesis circuit shown in FIG. 8, a pair of buffers 31, 32 for receiving the square-law curve signal B on the lower temperature side and the same B' on the higher temperature side, respectively, are installed, and between the buffers 31, 32, a resistor 33 on the lower temperature side and a resistor 34 on the higher temperature side, connected in series, are provided.

A voltage signal obtained from a node P2 connecting the resistor 33 on the lower temperature side to the resistor 34 on the higher temperature side through internal division, (B+B')/2, is a rectilinear correction signal C.

For the pair of buffers 31, 32, a non-inverting amplifier circuit with an amplification factor of 1 is generally employed, and since this is a well known circuit, description thereof is omitted.

There is a need for the resistor 33 on the lower temperature side and resistor 34 on the higher temperature side to have an equal temperature coefficient so as not to cause the rectilinear correction signal C to be distorted owing to the effect of temperature. However, there is no need for both resistors to necessarily have an equal resistance value.

In the case of compensating for temperature in the temperature range from −30° C. to +85° C., according to the CDMA specification, it is necessary to provide a wider width for frequency adjustment on the lower temperature side than on the higher temperature side in view of the temperature characteristic of the AT-cut crystal resonator. Hence it is rather preferable to provide a wider allowance for signal variation on the lower temperature side by setting the resistance of the resistor 33 on the lower temperature side at a value higher than that of the resistor 34 on the higher temperature side.

The curve 30 indicated by the broken line in FIG. 5 represents an example of the rectilinear correction signal C synthesized via the two resistors 33 and 34 having equal temperature coefficient.

The curve 30 is quite approximate to the cubic curve 13 shown in FIG. 2, and by controlling the frequency adjustment circuit 29 in FIG. 7 with the rectilinear correction signal as represented by the curve 30, temperature compensation of the AT-cut crystal resonator, called the flat crystal, can be executed in a wide temperature range.

Another example of the signal synthesis circuit 27 is described with reference to FIG. 9. The example represents a case where the same circuit (in this example, a series circuit formed by the n-channel MOS transistor 21 and the resistor 19 for square-law conversion as shown in FIG. 4) is employed for the square-law converter circuit 5 on the lower temperature side and the square-law converter circuit 7 on the higher temperature side.

A temperature detection signal A from the temperature sensor 3 is applied directly to the gate of the MOS transistor 21 of the square-law converter circuit 5 on the lower temperature side, and from the drain thereof, a square-law curve signal B on the lower temperature side is outputted. A signal NA obtained by inverting the temperature detection signal A from the temperature sensor 3 is applied to the gate of the MOS transistor 21 of the square-law converter circuit 7 on the higher temperature side, and from the drain thereof, a square-law curve signal B' on the higher temperature side is outputted. The square-law curve signal B' on the higher temperature side will be a signal with variation in voltage relative to temperature, inverted from that of the square-law curve signal 25 on the higher temperature side as shown in FIG. 5.

The signal synthesis circuit 27 in FIG. 9 is an inverting amplifier circuit comprising an operational amplifier 35, input resistor 36, and feedback resistor 37, wherein the square-law curve signal B on the lower temperature side is inputted to the non-inverting input terminal of the operational amplifier 35 while the square-law curve signal B' on the higher temperature side is inputted to the inverting input terminal of the operational amplifier 35 via the input resistor 36.

Accordingly, in the signal synthesis circuit 27 which is the inverting amplifier circuit, the square-law curve signal B' on the higher temperature side is inverted and added to the square-law curve signal B on the lower temperature side before amplification. The rectilinear correction signal C represented by the curve 30 as indicated by the broken line in FIG. 5 can be produced by this circuit as with the case of the circuit shown in FIG. 8.

In light of the object of the invention to expand the range for temperature compensation, the second embodiment of the invention as shown in FIG. 7 is more advantageous than the first embodiment shown in FIG. 1.

This is because when the frequency adjustment circuit 9 on the lower temperature side and the frequency adjustment circuit 11 on the higher temperature side are connected in parallel to the crystal oscillation circuit 1, as shown in FIG. 1, each of the frequency adjustment circuits represents a stray capacitance to the other.

Consequently, the range of frequency adjustment of the respective frequency adjustment circuits 9, 11 is reduced in width. On the other hand, in the case where there is only one circuit as the frequency adjustment circuit 29 connected to the crystal oscillation circuit 1, the range for temperature compensation is further expanded since any stray capacitance causing reduction in the width of the range of frequency adjustment does not exist.

Figure 10:
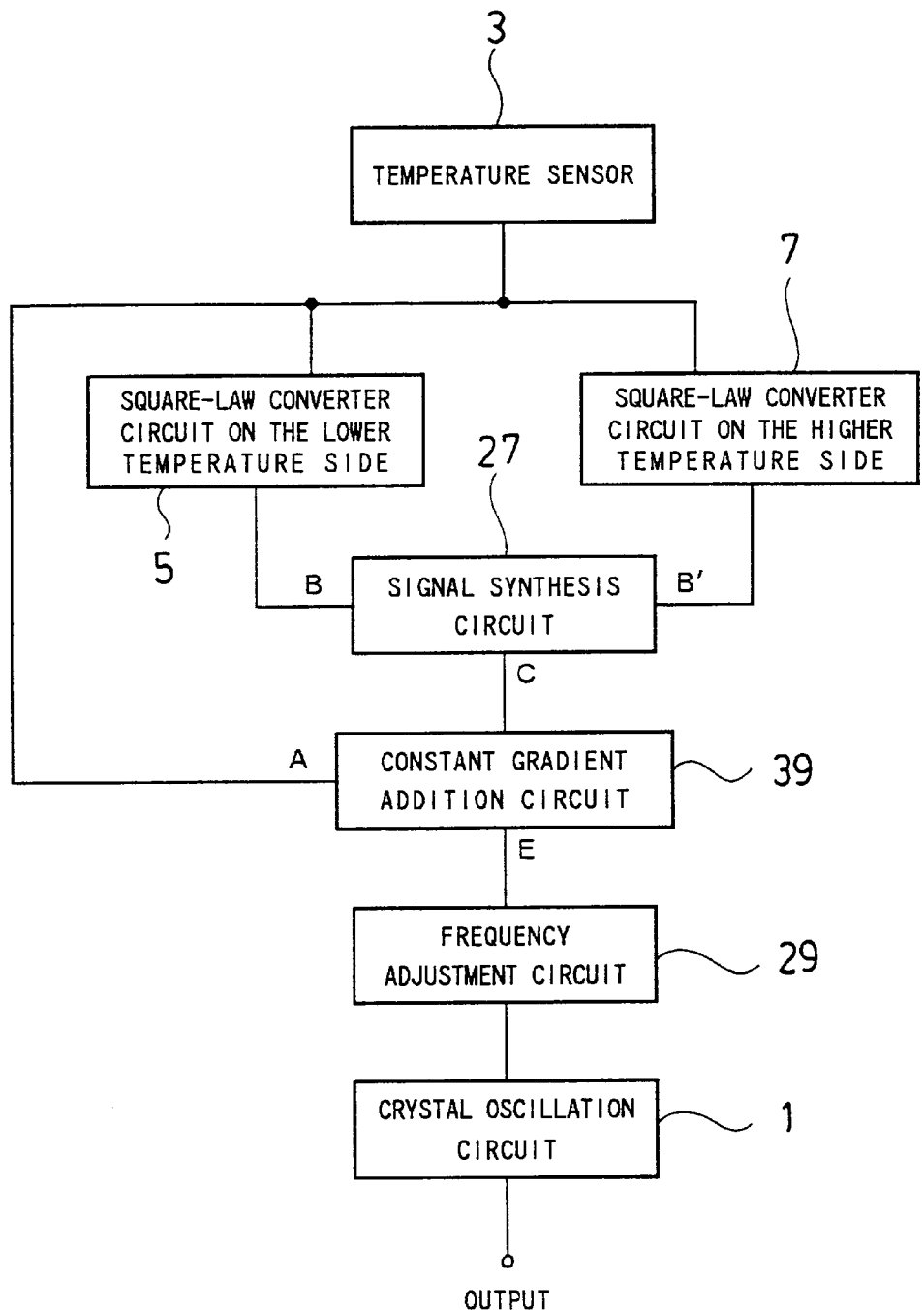
FIG. 10 is a block diagram showing a configuration of a third embodiment of a temperature-compensated crystal oscillator according to the invention.

Third Embodiment: FIGS. 9 and 10

Next, a third embodiment of a temperature-compensated crystal oscillator according to the invention is described. FIG. 10 is a block diagram showing a configuration of the temperature-compensated crystal oscillator.

In FIG. 10, parts corresponding to those shown in FIG. 7 are denoted by the same reference numerals, and description thereof is omitted. The temperature-compensated crystal oscillator shown in FIG. 10 differs from the temperature-compensated crystal oscillator shown in FIG. 7 in that a constant gradient addition circuit 39 is provided between a signal synthesis circuit 27 and a frequency adjustment circuit 29.

Further, a crystal resonator of a crystal oscillation circuit 1 according to this embodiment is not limited to the flat crystal employed in the respective embodiments described hereinbefore, but is an AT-cut crystal resonator having a temperature characteristic of an optional temperature gradient at approximately room temperature.

It is necessary to execute gradient correction in addition to the rectilinear correction in order to accomplish temperature compensation of such an AT-cut crystal resonator.

To this end, in the third embodiment of the invention, an output of the temperature sensor 3, at a voltage having a substantially linear temperature characteristic, is proportionally converted, generating a gradient correction signal while the constant gradient addition circuit 39 for adding the gradient correction signal to a rectilinear correction signal C outputted from the signal synthesis circuit 27 is provided.

The gradient correction can be achieved with a configuration wherein two frequency adjustment circuits for the gradient correction are connected to the crystal oscillation circuit 1 in parallel with the square-law converter circuit 5 on the lower temperature side, and the square-law converter circuit 7 on the higher temperature side, for the rectilinear correction. However, as described in the foregoing, an increase in the number of the frequency adjustment circuits connected to the crystal oscillation circuit 1 will create stray capacitances with respect to each other, bringing about disadvantageous results.

Hence, the third embodiment of the invention has a configuration wherein the constant gradient addition circuit 39 is provided for adding a gradient correction signal to a rectilinear correction signal C outputted from the signal synthesis circuit 27 to generate a temperature compensation signal so that temperature compensation of the crystal oscillation circuit 1 is accomplished with one circuit only, that is, the frequency adjustment circuit 29.

The constant gradient addition circuit 39 consists of two elements, one being a portion thereof for generating the gradient correction signal by proportionally converting the temperature detection signal A outputted from the temperature sensor 3, and the other being a portion thereof for adding the gradient correction signal to the rectilinear correction signal C.

In the latter portion, a type of signal synthesis is executed by combining the rectilinear correction signal with the gradient correction signal, and for this type of signal synthesis wherein the rectilinear correction signal is arranged by the gradient correction signal, an inverting amplifier is most suitable.

For the former portion of the constant gradient addition circuit 39 for generating the gradient correction signal as well, use of an inverting amplifier is most suitable.

This is because while an output of the temperature sensor 3 either increases or decreases flatly, the temperature characteristic of the AT-cut crystal resonator, the object for temperature compensation, includes both the temperature characteristic of the flat crystal with a positive gradient added thereto and the same with a negative gradient added thereto. Hence a circuit for generating the gradient correction signal is preferably a circuit capable of converting a straight line at a gradient in one direction into a straight line at a gradient in either direction, and a circuit of the simplest configuration, and yet capable of executing such an operation as described, is an inverting amplifier.

However, as the gradient correction signal must be generated to fit the temperature characteristic of the AT-cut crystal resonator, the configuration needs to be such that a proportional conversion factor can be externally adjusted.

Figure 11:
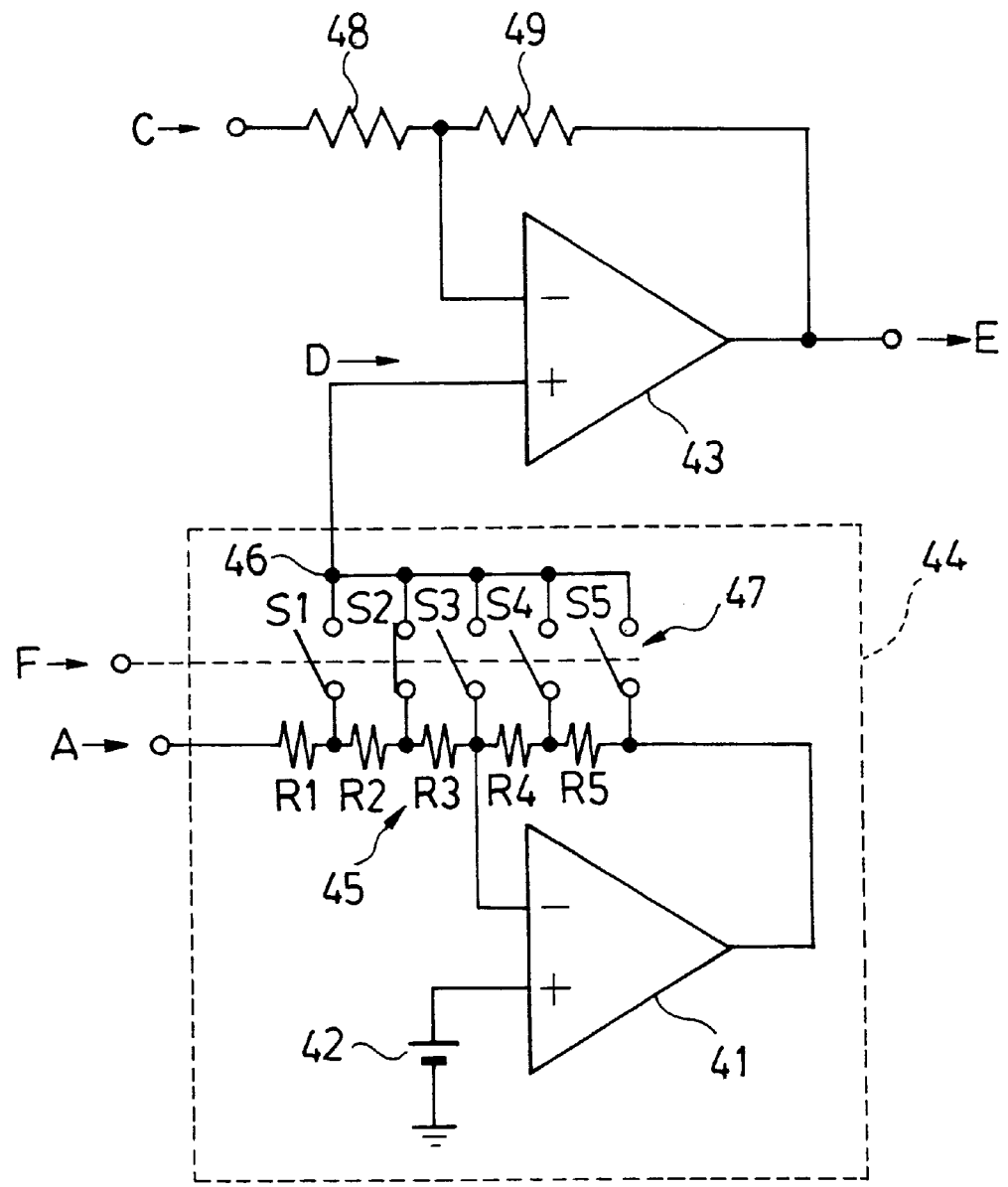
FIG. 11 is a circuit diagram showing an example of a constant gradient addition circuit 39 of the temperature-compensated crystal oscillator shown in FIG. 10.

FIG. 11 shows an example of the constant gradient addition circuit 39 made up of two inverting amplifiers, enabling such external adjustment.

In the constant gradient addition circuit 39 shown in FIG. 11, an operational amplifier 41 and a resistor group 45, for proportional conversion, make up an inverting amplifier, and a temperature detection signal A from the temperature sensor 3 is inputted thereto with a signal from a reference power source 42, having no temperature dependence, as an inversion point.

By use of a switch group 47 comprising a plurality of switches S1 to S5 with one terminal of each switch connected to each connection node among a plurality of resistors R1 to R5 connected in series making up a resistor group 45 for proportional conversion, and with the other terminal of each switch connected to a common terminal 46, and by selecting one of the switches to be turned on by a switch control signal F instead of directly using an output of the inverting amplifier, a gradient correction signal D outputted from the common terminal 46 is adjusted. The respective connection nodes among the plurality of resistors R1 to R5 making up the resistor group 45 for proportional conversion constitute a plurality of different potential points between the input terminal and output terminal of the inverting amplifier.

The portion composed of the inverting amplifier and the switch group 47 is a proportional conversion circuit 44, representing the former portion of the constant gradient addition circuit 39 shown in FIG. 10.

The latter portion of the constant gradient addition circuit 39 is another inverting amplifier comprising an operational amplifier 43 for gradient addition, input resistor 48 and feedback resistor 49 as shown in FIG. 11, wherein the rectilinear correction signal C is inputted and inverted with the gradient correction signal D as an inversion point.

Upon inversion of the rectilinear correction signal C by the inverting amplifier, the inversion point is shifted by the gradient correction signal D, and consequently, an inverted signal of the rectilinear correction signal C is provided with a gradient, producing a temperature compensation signal E.

The switch control signal F is generated with the use of the nonvolatile memory, but there is no need for measuring the temperature characteristic of the temperature-compensated crystal oscillator for writing necessary data to the memory. It is sufficient to utilize information on the temperature characteristic of the AT-cut crystal resonator, obtained in the manufacturing stage thereof.

Accordingly, the writing of the data for gradient correction can be executed on the basis of one point, that is, the reference temperature (normally, at 25° C.), and the cost of adjustment is quite low.

Even if the information on the temperature characteristic of the AT-cut crystal resonator is unavailable at the manufacturing stage thereof, writing of the data for gradient correction can be executed by measuring frequencies at two optional temperature points since the rectilinear correction has already been completed by then.

As the reference temperature for f-zero adjustment is normally adopted as one of the two optional temperature points, it is sufficient to measure a frequency at one temperature point in practice even when measuring the temperature characteristic for gradient correction.

As is evident from the foregoing description on the third embodiment, temperature compensation of the AT-cut crystal resonator having an optional temperature gradient can be achieved by providing the rectilinear correction signal with a gradient by use of the constant gradient addition circuit 39.

Figure 12:
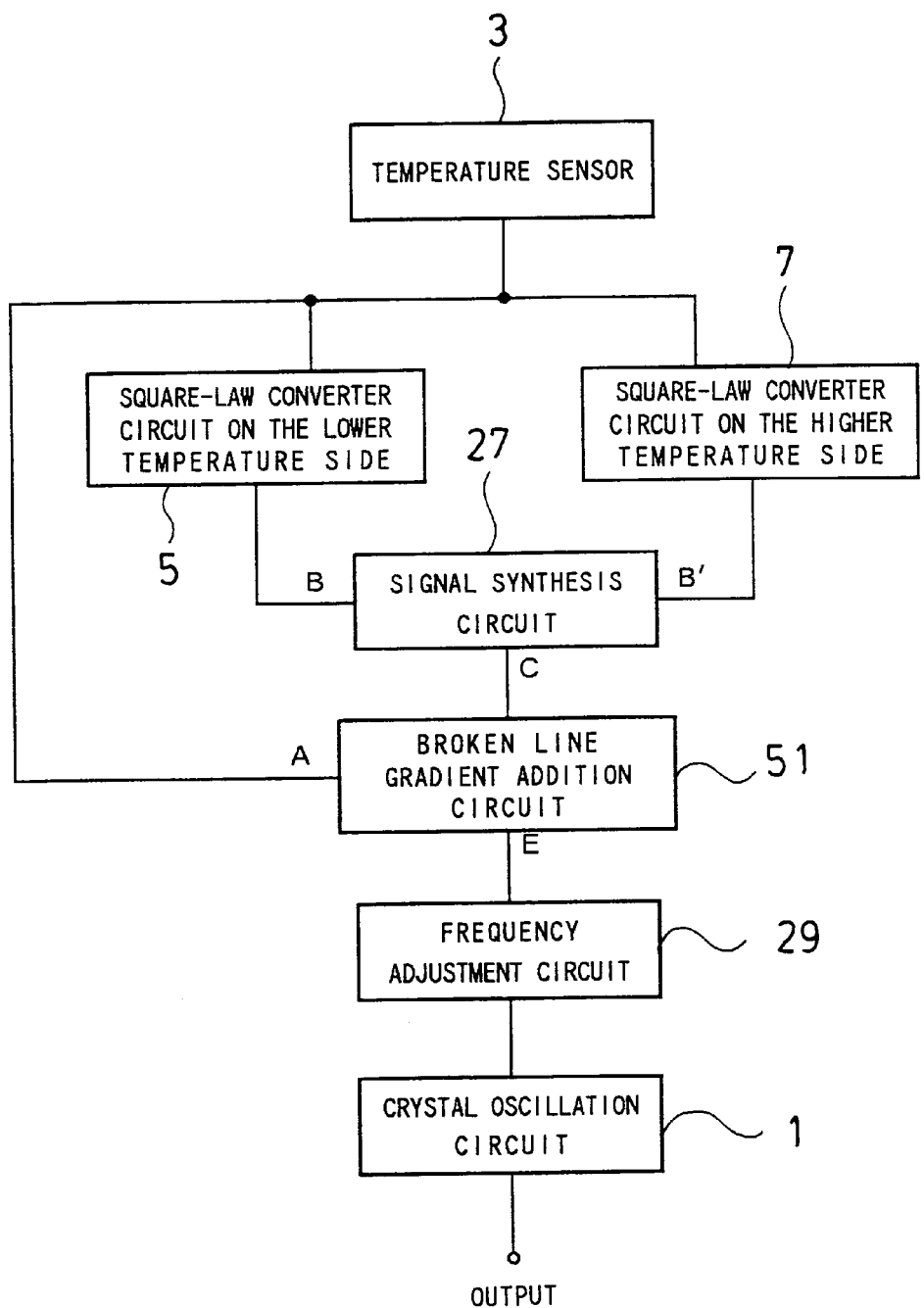
FIG. 12 is a block diagram showing a configuration of a fourth embodiment of a temperature-compensated crystal oscillator according to the invention.
Figure 13:
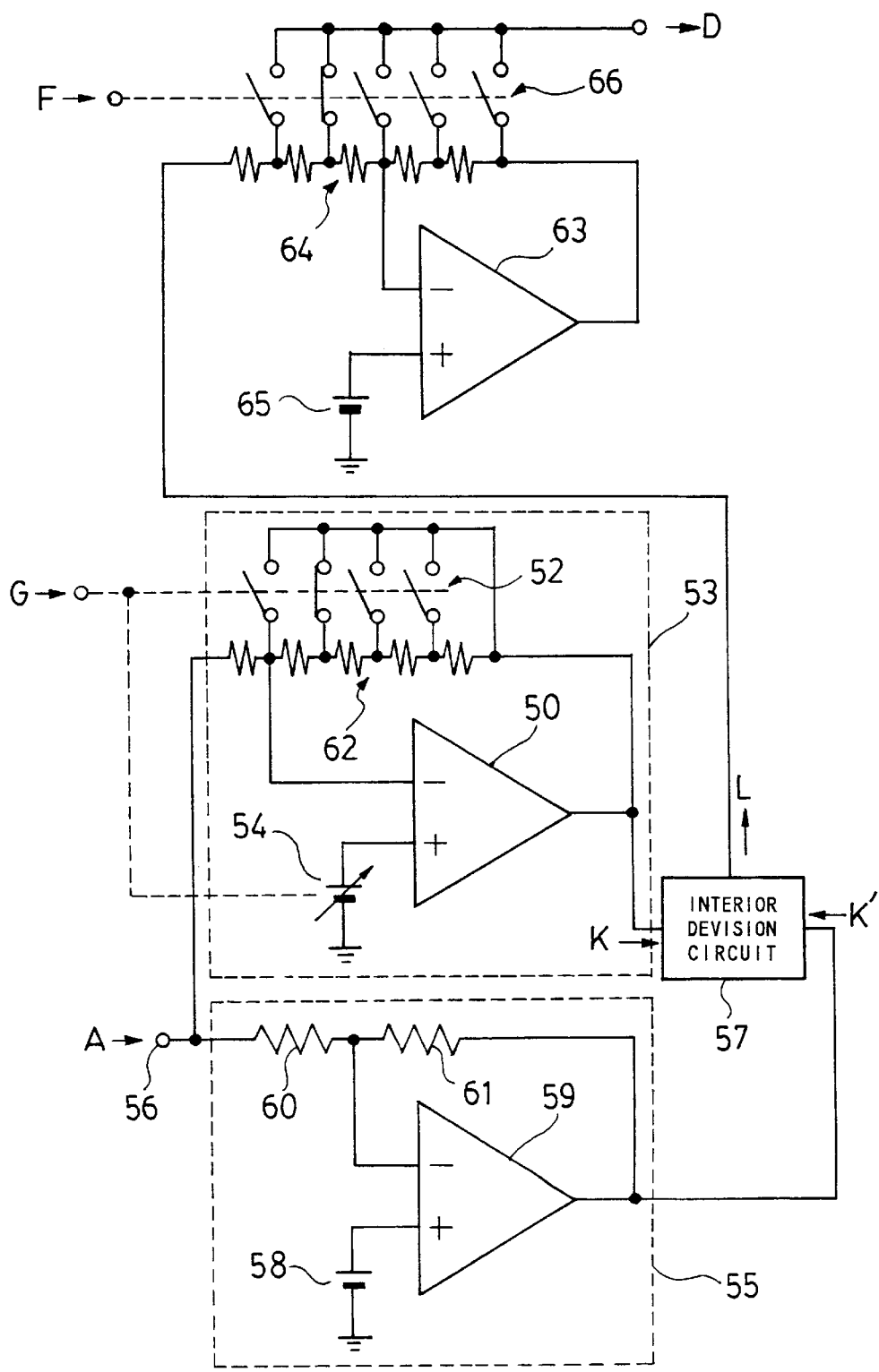
FIG. 13 is a circuit diagram showing an example of a broken line gradient signal generation circuit constituting the main part of a broken line gradient addition circuit 51 of the temperature-compensated crystal oscillator shown in FIG. 12.

Fourth Embodiment: FIGS. 12 and 13

Next, a fourth embodiment of a temperature-compensated crystal oscillator according to the invention is described. FIG. 12 is a block diagram showing a configuration of the temperature-compensated crystal oscillator.

In FIG. 12, parts corresponding to those shown in FIG. 10 are denoted by the same reference numerals, and description thereof is omitted. The temperature-compensated crystal oscillator shown in FIG. 12 differs from the temperature-compensated crystal oscillator shown in FIG. 10 in that in place of the constant gradient addition circuit 39, a broken line gradient addition circuit 51 is provided.

The broken line gradient addition circuit 51 is a circuit wherein a broken line gradient signal for executing gradient correction of a temperature detection signal A on the lower temperature side and the higher temperature side, respectively, is generated while the broken line gradient signal is added to a rectilinear correction signal C delivered from a signal synthesis circuit 27. A frequency adjustment circuit 29 is under control of the broken line gradient addition circuit 51.

If the crystal resonator of a crystal oscillation circuit 1 is a common AT-cut crystal resonator having an optional temperature gradient, temperature compensation can be achieved by providing the rectilinear correction signal with a constant gradient over the entire temperature range as with the case of the third embodiment described above. However, with some AT-cut crystal resonators, gradient correction must be executed by use of different factors for the lower temperature side and higher temperature side, respectively, due to distortion in the temperature characteristic thereof and so forth.

Even without such distortion in the temperature characteristic, since information on the temperature characteristic which is available in the manufacturing stage of the AT-cut crystal resonator is that for the temperature on the higher side, normally around 70° C., gradient correction executed based on such information will result in an increase in the percentage of the oscillation frequency on the lower temperature side deviating from the specification.

In such a case, yield will be improved and frequency precision will be enhanced if the gradient correction factor for the lower temperature side only is changed without changing the same for the higher temperature side, where the specification is met, rather than to change the same for the entire temperature range.

Therefore, in the fourth embodiment shown in FIG. 12, the broken line gradient addition circuit 51 is configured such that different gradients are provided for the lower temperature side and higher temperature side, respectively.

The broken line gradient addition circuit 51 consists of two elements, one being a portion thereof for generating a broken line gradient signal from the temperature detection signal A outputted by the temperature sensor 3, and the other being another portion thereof for adding the broken line gradient signal to the rectilinear correction signal C outputted by the signal synthesis circuit 27.

The latter portion thereof may be made up of an inverting amplifier as with the case of the same of the constant gradient addition circuit 39 described hereinbefore.

The former portion of the broken line gradient addition circuit 51, for generating the broken line gradient signal, can be easily made up by combination of an interior division circuit and inverting amplifiers, and FIG. 13 shows an example thereof.

In FIG. 13, a broken line gradient addition circuit comprising three inverting amplifiers and one interior division circuit is shown by way of example.

The circuit incorporates a gradient generation circuit 53 on the lower temperature side composed of an inverting amplifier comprising an operational amplifier 50 and a resistor group 62, a switch group 52 made up of switches respectively controlled by a gradient control signal G on the lower temperature side, and a variable power source 54 for an inversion point.

The resistor group 62 comprises a plurality of resistors connected in series and extended between the input terminal 56 and the output terminal of the operational amplifier 50 while one end of each of the switches making up the switch group 52 is connected to each of plural connecting nodes between the respective resistors, and the other ends thereof are connected to the output terminal of the operational amplifier 50, in common with all the switches.

The gradient generation circuit 53 on the lower temperature side receives the temperature detection signal A outputted by the temperature sensor 3 and delivered from the input terminal 56, generating a signal at a predetermined voltage in case ambient temperature is not lower than the reference temperature, and generating a gradient signal K on the lower temperature side, having a constant gradient, in case the ambient temperature is lower than the reference temperature.

Further, a gradient generation circuit 55 on the higher temperature side comprises a power source 58 for a fixed inversion point, and an inverting amplifier comprising an operational amplifier 59, input resistor 60 and feedback resistor 61. The gradient generation circuit 55 on the higher temperature side receives the temperature detection signal A outputted by the temperature sensor 3 and delivered from the input terminal 56 thereof, in common with the gradient generation circuit 53 on the lower temperature side, generating a signal at a predetermined voltage in case ambient temperature is not higher than the reference temperature corresponding to the inversion point dependent on the power source 58, and generating a gradient signal K' on the higher temperature side, having a constant gradient, in case ambient temperature is higher than the reference temperature.

The gradient signal K on the lower temperature side and gradient signal K' on the higher temperature side are inputted to the interior division circuit 57, which in turn generates a broken line signal L with a line broken at the reference temperature by an interior division output thereof, (K+K')/2.

The broken line signal L is inputted to an inverting amplifier composed of an operational amplifier 63, a resistor group 64 comprising a plurality of resistors, that is, input resistors of the amplifier and feedback resistors series connected thereto, a power source 65 for a fixed inversion point, and a switch group 66 comprising a plurality of switches extended between connecting nodes between the respective resistors of the resistor group 64 and the output terminal. Any of the plurality of switches of the switch group 66 is selected by a switch control signal F, and is turned on so that a broken line gradient signal D is eventually generated by the inverting amplifier.

As with the case of the constant gradient addition circuit in FIG. 11, by use of an inverting amplifier (corresponding to the inverting amplifier comprising the operational amplifier 43, input resistor 48, and feedback resistor 49, shown in FIG. 11) to which the rectilinear correction signal C is inputted with the broken line gradient signal D as an inversion point, the rectilinear correction signal C is provided with a broken line gradient, producing a temperature compensation signal E, although this is not shown in FIG. 13.

Thus, with the use of the broken line gradient addition circuit 51 described above, the temperature-compensated crystal oscillator having a higher frequency precision can be provided. The higher the frequency precision is, the easier it is to expand the range of temperature compensation.

Method of Adjusting the Temperature-Compensated Crystal Oscillator

Having described the first to fourth embodiments of the temperature-compensated crystal oscillator according to the invention hereinbefore, a method of adjusting the temperature-compensated crystal oscillator is described hereinafter.

First, a method of adjusting the temperature-compensated crystal oscillator according to the fourth embodiment of the invention is as follows.

That is, the method of adjustment comprises: a step of adjusting the magnitude of the gradient on the lower temperature side and the higher temperature side, respectively, at the reference temperature on the basis of information on the temperature characteristic of the frequency of the AT-cut crystal resonator, obtained at the manufacturing stage; a step of inspection prior to delivery for measuring the oscillation frequency at a number of different temperatures; and, a step of adjusting the magnitude of a gradient on the lower temperature side of the broken line gradient addition circuit against products rejected during the inspection prior to delivery.

The information on the temperature characteristic of the frequency of the AT-cut crystal resonator, obtained at the manufacturing stage, represents information on the same normally at 70° C., and if the inspection prior to delivery is executed by adjusting the magnitude of gradient on the lower temperature side and the higher temperature side of the broken line gradient addition circuit 51, respectively, at the reference temperature on the basis of such information, a percentage of the frequency whose precision on the lower temperature side deviates from the specification will increase although the frequency precision on the higher temperature side will fall within the specification.

Readjustment of such nonconforming parts is required, but if the gradient is changed over the entire temperature range, the frequency precision on the higher temperature side will deteriorate, resulting in an increased percentage of frequency deviation from the specification.

Accordingly, if the gradient correction is changed only on the lower temperature side without changing the same on the higher temperature side, there will be a marked increase in the probability of the frequency precision falling within the specification.

A change in the gradient correction on the lower temperature side is executed by rewriting data to the nonvolatile memory at the reference temperature on the basis of information resulting from the inspection prior to delivery, thus incurring a very low cost of adjustment.

In this connection, to enable such a method of adjustment, the nonvolatile memory for adjusting the gradient on at least the lower temperature side needs to be rewritable.

Then, a method of adjusting the temperature-compensated crystal oscillator according to the third embodiment of the invention is as follows.

That is, the method of adjustment comprises: a step of adjusting the magnitude of a gradient of the constant gradient addition circuit 39, at the reference temperature, on the basis of information on the temperature characteristic of the frequency of the AT-cut crystal resonator, obtained in the manufacturing stage; a step of inspection prior to delivery for measuring the oscillation frequency at a number of different temperatures; and, a step of adjusting the conversion factor of the square-law converter circuit on the lower temperature side against products rejected during the inspection prior to delivery.

As described in the foregoing, the frequency precision found nonconforming at the inspection prior to delivery occurs mostly on the lower temperature side only. However, in the third embodiment of the invention, correction for a constant gradient is performed across the entire temperature range. Consequently, it is impossible to change gradient correction on the lower temperature side only against products that turn out nonconforming during the inspection prior to delivery.

However, it often happens that the frequency precision in the proximity of the reference temperature falls within the specification even in the case of the frequency precision deviating from the specification, and the magnitude of deviation from the specification increases as ambient temperature declines from 15° C.

In such a case, the frequency can be brought within the specification by readjusting the conversion factor of the square-law converter circuit on the lower temperature side without changing the gradient correction.

The readjustment of the conversion factor of the square-law converter circuit on the lower temperature side can be executed by rewriting the data to the nonvolatile memory at the reference temperature on the basis of information obtained at the time of the inspection prior to delivery, incurring a very low cost of adjustment.

In this connection, to enable such a method of adjustment, the nonvolatile memory for adjusting the conversion factor of the square-law converter circuit on at least the lower temperature side needs to be rewritable.

Thus with the temperature-compensated crystal oscillator according to the invention, the cost of adjustment except for cost of inspection prior to delivery is kept very low by implementing a method of adjustment whereby data for temperature compensation is written at one point of the reference temperature, and the rectilinear correction or gradient correction is readjusted for the lower temperature side only on the basis of information obtained through the inspection prior to delivery against products proving to be nonconforming upon the inspection.

Although the invention has been described in detail as above on the basis of various embodiments thereof, it will be obvious to those skilled in the art that the invention is not limited by any of the details of description, and changes and variations may be made in the invention without departing from the spirit and scope thereof.

For example, the temperature sensor 3, the square-law converter circuit 5 on the lower temperature side, and the square-law converter circuit 7 on the higher temperature side may be respectively made up of a series connected circuit composed of identical conductive type MOS transistors manufactured by the identical manufacturing process, having the identical characteristic, and resistors manufactured by the identical manufacturing process, having the identical characteristic.

With the configuration as described, the temperature-compensated crystal oscillator can be adjusted with greater ease because circuits for correcting the manufacturing spread of the MOS transistors as well as circuits for correcting the manufacturing spread of the resistors can be collectively controlled by nonvolatile memories, respectively.

Further, for correction of the manufacturing spread of devices on a semiconductor IC, a one-time programmable memory (OTPROM) may preferably be used for the nonvolatile memory, completing writing of data at the wafer testing stage.

This makes it unnecessary to provide, on package for the temperature-compensated crystal oscillator, terminals for measuring the manufacturing spreads of the resistors and the MOS transistors.

The reason for use of the one-time programmable memory for the nonvolatile memory is to prevent data previously entered in the memory from being erased in the middle of a mounting process.

If there is no risk of data stored in the rewritable nonvolatile memory being erased in the mounting process, use of the one-time programmable memory is unnecessary.

Meanwhile, the reason why the temperature-compensated crystal oscillator according to the invention basically belonging to one-chip analog temperature-compensated crystal oscillators incurs little cost of adjustment in contrast with the one-chip analog temperature-compensated crystal oscillators is that since the temperature compensation signal is synthesized by combining the rectilinear correction signal and gradient correction signal, separately generated, data can be written at the reference temperature simply by utilizing information based on the temperature characteristic of the AT-cut crystal resonator.

Accordingly, in the case of the conventional one-chip analog temperature-compensated crystal oscillator provided with a cubic function generation circuit, the cost of adjustment can be reduced through improvement thereof by applying the same concept thereto.

More specifically, if the cubic function generation circuit is made up of a rectilinear correction signal generation circuit for generating a cubic curve signal in common with all AT-cut crystal resonators by frequency, and a gradient correction addition circuit for adding a constant gradient to the cubic curve signal across the entire range of application temperatures, data can be written at the reference temperature simply by utilizing information on the temperature characteristic of the AT-cut crystal resonators, incurring little cost of adjustment.

However, the method described above can achieve improvement only in respect of cost of adjustment, and the scale of the semiconductor IC remains as large as before. Therefore, the previously described method of approximating the temperature characteristic of a signal to the cubic curve by use of the square-law curve signal is superior to this method.

As described in the foregoing, with the temperature-compensated crystal oscillator according to the invention, a signal for compensating for the temperature characteristic of the crystal oscillation circuit employing the AT-cut crystal resonator having a substantially constant frequency at approximately room temperature, as expressed by a cubic function curve, is generated by dividing an output from the temperature sensor into one on the lower temperature side and the other on the higher temperature side before converting the same to the square-law curve signals having a temperature characteristic approximate to a cubic function curve, enabling temperature compensation across a wide temperature range with a simple circuit configuration.

Further, in the case of employing the AT-cut crystal resonator having an optional gradient at approximately room temperature, the rectilinear correction signal can be produced through a circuit of a simple configuration by adoption of an process wherein the temperature compensation signal is synthesized by combining the rectilinear correction signal with the gradient correction signal, which are first separately generated, incurring little cost of adjustment. Hence, the temperature-compensated crystal oscillator capable of expanding the range of temperature compensation can be provided at low cost.

Consequently, if the invention is applied to a temperature-compensated crystal oscillator, particularly, for use in a cellular phone conforming to CDMA specifications, the effect of the invention will be quite significant.

What is claimed is:

1. A temperature-compensated crystal oscillator comprising:
   a crystal oscillation circuit employing an AT-cut crystal resonator having a substantially constant oscillation frequency at approximately room temperature;
   a temperature sensor with an output having a substantially rectilinear temperature characteristic;
   a square-law converter circuit on a lower temperature side for converting an output of the temperature sensor into a square-law curve signal on the lower temperature side;
   a frequency adjustment circuit on the lower temperature side, under control of the square-law converter circuit on the lower temperature side, for adjusting the oscillation frequency of the crystal oscillation circuit;
   a square-law converter circuit on a higher temperature side for converting the output of the temperature sensor into a square-law curve signal on the higher temperature side; and
   a frequency adjustment circuit on the higher temperature side, under control of the square-law converter circuit on the higher temperature side, for adjusting the oscillation frequency of the crystal oscillation circuit.

2. A temperature-compensated crystal oscillator according to claim 1, wherein the square-law converter circuit on the lower temperature side and the square-law converter circuit on the higher temperature side comprise a circuit formed of a MOS transistor and a resistor connected in series, respectively, and a gate of the respective MOS transistors is used as the input terminal of the respective circuits while a drain of the respective MOS transistors is used as an output terminal of the respective circuits.

3. A temperature-compensated crystal oscillator according to claim 1, wherein either of the square-law converter circuit on the lower temperature side or the square-law converter circuit on the higher temperature side comprises a circuit formed of a p-channel MOS transistor and a resistor connected in series and the other circuit comprises a circuit formed of an n-channel MOS transistor and a resistor connected in series, the respective MOS transistors having a gate used as an input terminal of the respective circuits and a drain used as an output terminal of the respective circuits.

4. A temperature-compensated crystal oscillator comprising:
   a crystal oscillation circuit employing an AT-cut crystal resonator having a substantially constant oscillation frequency at approximately room temperature;
   a temperature sensor with an output having a substantially rectilinear temperature characteristic;
   a square-law converter circuit on a lower temperature side for converting the output of the temperature sensor into a square-law curve signal on the lower temperature side;
   a square-law converter circuit on a higher temperature side for converting the output of the temperature sensor into a square-law curve signal on the higher temperature side;
   a signal synthesis circuit for combining the square-law curve signal on the lower temperature side generated by the square-law converter circuit on the lower temperature side with the square-law curve signal on the higher temperature side generated by the square-law converter circuit on the higher temperature side; and a
   frequency adjustment circuit under control of the signal synthesis circuit, for adjusting the oscillation frequency of the crystal oscillation circuit.

5. A temperature-compensated crystal oscillator according to claim 4, wherein the signal synthesis circuit is a circuit for combining the square-law curve signal generated by the square-law converter circuit on the lower temperature side with the square-law curve signal generated by the square-law converter circuit on the higher temperature side via two resistors each having an equal temperature coefficient.

6. A temperature-compensated crystal oscillator according to claim 4, wherein the signal synthesis circuit is a circuit for combining the square-law curve signal generated by the square-law converter circuit on the lower temperature side with the square-law curve signal generated by the square-law converter circuit on the higher temperature side via a resistor on the lower temperature side and the higher temperature side, respectively, each having an equal temperature coefficient, a resistance value of the resistor on the lower temperature side being greater than that of the resistor on the higher temperature side.

7. A temperature-compensated crystal oscillator according to claim 4, wherein the square-law converter circuit on the lower temperature side and the square-law converter circuit on the higher temperature side are circuits of the same configuration, and the signal synthesis circuit is an inverting amplifier for inverting either of the square-law curve signal generated by the square-law converter circuit on the lower temperature side or the square-law curve signal generated by the square-law converter circuit on the higher temperature side, and adding the other thereto before amplification.

8. A temperature-compensated crystal oscillator comprising:
   a crystal oscillation circuit employing an AT-cut crystal resonator;
   a temperature sensor with an output having a substantially rectilinear temperature characteristic;
   a square-law converter circuit on a lower temperature side for converting the output of the temperature sensor into a square-law curve signal on the lower temperature side;
   a square-law converter circuit on a higher temperature side for converting the output of the temperature sensor into a square-law curve signal on the higher temperature side;
   a signal synthesis circuit for combining the square-law curve signal generated by the square-law converter circuit on the lower temperature side with the square-law curve signal generated by the square-law converter circuit on the higher temperature side;
   a constant gradient addition circuit for adding an adjustable constant gradient over an entire range of application temperatures to an output of the signal synthesis circuit; and
   a frequency adjustment circuit under control of the constant gradient addition circuit, for adjusting the oscillation frequency of the crystal oscillation circuit.

9. A temperature-compensated crystal oscillator according to claim 8, wherein the constant gradient addition circuit comprises a proportional conversion circuit for generating a proportion signal against the output of the temperature sensor by an externally adjustable proportion factor, and an inverting amplifier for receiving and inverting an output of the signal synthesis circuit with the proportion signal generated by the proportional conversion circuit as an inversion point.

10. A temperature-compensated crystal oscillator according to claim 9, in which the proportional conversion circuit comprises:
    an inverting amplifier for inverting the output of the temperature sensor with a signal having no temperature dependence as an inversion point;
    a switch group consisting of a plurality of switches with one terminal of each switch connected, to a plurality of nodes at different potentials between an input terminal and output terminal of the inverting amplifier, and with all the other terminals of each switch connected to a common terminal; and
    a nonvolatile memory storing data for controlling ON/OFF switching of the respective switches making up the switch group, the common terminal of the switch group being used as the output terminal of the proportion signal.

11. A temperature-compensated crystal oscillator comprising:
    a crystal oscillation circuit employing an AT-cut crystal resonator;
    a temperature sensor with an output having a substantially rectilinear temperature characteristic;
    a square-law converter circuit on a lower temperature side for converting the output of the temperature sensor into a square-law curve signal on the lower temperature side;
    a square-law converter circuit on a higher temperature side for converting the output of the temperature sensor into a square-law curve signal on the higher temperature side;
    a signal synthesis circuit for combining the square-law curve signal generated by the square-law converter circuit on the lower temperature side with the square-law curve signal generated by the square-law converter circuit on the higher temperature side;
    a broken line gradient addition circuit for adding an adjustable gradient to an output of the signal synthesis circuit, on the lower temperature side and on the higher temperature side, separately; and
    a frequency adjustment circuit under control of the broken line gradient addition circuit, for adjusting the oscillation frequency of the crystal oscillation circuit.

12. A temperature-compensated crystal oscillator according to claim 11, wherein the broken line gradient addition circuit comprises:
    a conversion circuit on the lower temperature side for outputting a signal proportional to the output of the temperature sensor if the ambient temperature is not higher than a reference temperature, and outputting a constant signal if the ambient temperature is above the reference temperature;
    a conversion circuit on the higher temperature side for outputting a signal proportional to the output of the temperature sensor if the ambient temperature is not lower than the reference temperature, and outputting a constant signal if the ambient temperature is below the reference temperature;
    a circuit for generating a broken line signal by combining an output of the conversion circuit on the lower temperature side with an output of the conversion circuit on the higher temperature side; and
    an inverting amplifier for receiving and inverting the output of the signal synthesis circuit with the broken line signal as an inversion point.

13. A temperature-compensated crystal oscillator according to claim 1, wherein the temperature sensor, square-law converter circuit on the lower temperature side, and square-law converter circuit on the higher temperature side, respectively, comprise a series-connected circuit formed of MOS transistors having identical characteristics and resistors having identical characteristics, provided with a circuit for correcting manufacturing spreads of the MOS transistors and a circuit for correcting manufacturing spreads of the resistors, respectively, said crystal oscillator further comprising a nonvolatile memory storing data for collectively controlling the circuit for correcting the manufacturing spreads of the MOS transistors and the circuit for correcting the manufacturing spreads of the resistors.

14. A temperature-compensated crystal oscillator according to claim 4, wherein the temperature sensor, square-law converter circuit on the lower temperature side, and square-law converter circuit on the higher temperature side, respectively, comprise a series-connected circuit formed of MOS transistors having identical characteristics and resistors having identical characteristics, provided with a circuit for correcting manufacturing spreads of the MOS transistors and a circuit for correcting manufacturing spreads of the resistors, respectively, said crystal oscillator further comprising a nonvolatile memory storing data for collectively controlling the circuit for correcting the manufacturing spreads of the MOS transistors and the circuit for correcting the manufacturing spreads of the resistors.

15. A temperature-compensated crystal oscillator according to claim 8, wherein the temperature sensor, square-law converter circuit on the lower temperature side, and square-law converter circuit on the higher temperature side, respectively, comprise a series-connected circuit formed of MOS transistors having identical characteristics and resistors having identical characteristics, provided with a circuit for correcting manufacturing spreads of the MOS transistors and a circuit for correcting manufacturing spreads of the resistors, respectively, said crystal oscillator further comprising a nonvolatile memory storing data for collectively controlling the circuit for correcting manufacturing spreads of the MOS transistors and the circuit for correcting manufacturing spreads of the resistors.

16. A temperature-compensated crystal oscillator according to claim 11, wherein the temperature sensor, square-law converter circuit on the lower temperature side, and square-law converter circuit on the higher temperature side, respectively, comprise a series-connected circuit formed of MOS transistors having identical characteristics and resistors having identical characteristics, provided with a circuit for correcting manufacturing spreads of the MOS transistors and a circuit for correcting manufacturing spreads of the resistors, respectively, said crystal oscillator further comprising a nonvolatile memory storing data for collectively controlling the circuit for correcting manufacturing spreads of the MOS transistors and the circuit for correcting manufacturing spreads of the resistors.

17. A temperature-compensated crystal oscillator according to claim 1, further comprising a circuit for correcting manufacturing spreads of the temperature sensor, square-law converter circuit on the lower temperature side, and square-law converter circuit on the higher temperature side, respectively, by a one-time programmable memory.

18. A temperature-compensated crystal oscillator according to claim 4, further comprising a circuit for correcting manufacturing spreads of the temperature sensor, square-law converter circuit on the lower temperature side, and square-law converter circuit on the higher temperature side, respectively, by a one-time programmable memory.

19. A temperature-compensated crystal oscillator according to claim 8, further comprising a circuit for correcting manufacturing spreads of the temperature sensor, square-law converter circuit on the lower temperature side, and square-law converter circuit on the higher temperature side, respectively, by a one-time programmable memory.

20. A temperature-compensated crystal oscillator according to claim 11, further comprising a circuit for correcting manufacturing spreads of the temperature sensor, square-law converter circuit on the lower temperature side, and square-law converter circuit on the higher temperature side, respectively, by a one-time programmable memory.

* * * * *